United States Patent [19]

Hirsch

[11] 3,999,181
[45] Dec. 21, 1976

[54] NON-LINEAR DIGITAL-TO-ANALOG CONVERTOR

[75] Inventor: Jean-Jacques Hirsch, Claix, France

[73] Assignee: Societe Generale de Constructions Electriques et Mechaniques Alsthom, Paris, France

[22] Filed: Oct. 24, 1974

[21] Appl. No.: 517,836

[30] Foreign Application Priority Data
Oct. 31, 1973 France .............................. 73.38812

[52] U.S. Cl. .................. 340/347 DA; 179/15 AV; 340/146.2
[51] Int. Cl.² ........................................ H03K 13/02
[58] Field of Search ... 340/347 DA, 146.2, 347 DD; 235/150.3, 150.1; 179/15 AV

[56] References Cited
UNITED STATES PATENTS

| | | | |
|---|---|---|---|
| 2,894,254 | 7/1959 | Mork .............. | 340/347 DA |
| 3,562,743 | 2/1971 | Lerouge et al. .................. | 340/347 |
| 3,582,941 | 6/1971 | Le Maout et al. ................. | 340/347 |
| 3,612,845 | 10/1971 | Lawlor .............................. | 235/156 |
| 3,632,996 | 1/1972 | Paine et al. ................ | 340/347 DA |
| 3,752,970 | 8/1973 | Aaron et al. .................. | 179/15 AV |
| 3,754,233 | 8/1973 | Sutherland .................. | 340/347 DA |
| 3,835,452 | 9/1974 | Zirphile .......................... | 340/146.2 |
| 3,836,908 | 9/1974 | Hegendorfer ............. | 340/347 DA |
| 3,887,911 | 6/1975 | Bell ............................. | 340/347 DA |

Primary Examiner—Thomas J. Sloyan
Attorney, Agent, or Firm—Haseltine, Lake & Waters

[57] ABSTRACT

Non-linear convertor for converting a data item given in digital form into an analog data item, the value of the digital data item being defined by position digits inside a range of values defined by range digit, characterized in that the convertor comprises a stochastic linear coder receiving the position digits and range digits and supplying a first stochastic data item, an adjustable probability divider whose division ratio is determined by the range digits, receiving that first stochastic data item supplying a second stochastic data item and being followed by a flux-former circuit and a low-pass filter giving the analog output data item.

7 Claims, 8 Drawing Figures

NON-LINEAR DIGITAL-TO-ANALOG CONVERTOR

BACKGROUND OF THE INVENTION

The invention relates to convertors for converting data given in digital form into data in analog form.

Such a convertor may be used by itself in order to have available data in analog form. It may also form a part of an analog-to-digital convertor in which it is used for transforming digital output data given by a reversible counter into auxiliary analog data, the reversible counter being driven by the difference between that auxiliary analog data and the input analog data to be converted.

More and more applications are being found for digital-to-analog and analog-to-digital convertors because of the advantage of transmission of data in digital form.

In certain applications, a linear conversion is not satisfactory. Thus, in telephony, a linear conversion would lead to intolerable quantification noises. As the installing at each subscriber set of an analog-to-digital convertor and of a digital-to-analog convertor is anticipated, there arises the problem of providing non-linear convertors which are not very expensive, which may follow a predetermined data expansion or compression law.

The problem which arises in telephony is found again in certain calculating operations such as the extraction of square roots and in numerous other applications of digital-to-analog and analog-to-digital convertors.

In these applications, the ideal relation which should be established between the digital data and the analog data is known, that relation resulting in a curve which may, with a certain approximation, be related to a sequence of segments of straight lines. It is thus possible to distribute the various possible values of the digital data into a certain number of ranges, in such a way that within a same range, the relation between the analog data and the digital data of a convertor will be linear.

SUMMARY OF THE INVENTION

It has been found, according to the present invention, that it was possible to produce that approximate relation in the very process of converting digital data into analog data, instead of effecting on the one hand, a purely linear conversion and on the other hand, a compression or extension before or after the conversion.

The result of this is a simplification of the conversion unit and the possibility of forming all the logic part of the that unit in the form of an integrated circuit.

For that purpose, the invention provides a convertor for input data given in digital form to be converted into output data in analog form, which makes it possible for the contingent values of the input data to be divided up into ranges of values each of these ranges being defined by range digits and comprising a sequence of values defined in each range by position digits, to establish a different relation between input and output according to the stage of values in which the input data is situated, characterized in that it comprises: a linear coder receiving the position digits and at least one digit whose value is determined by the range digits and supplying a first stochastic data item, an adjustable probability divider, whose division ratio is determined by the range digits, receiving that first stochastic data item and supplying a second stochastic data item, a pulse former circuit for that second stochastic data item and a low-pass filter transforming the second stochastic data item leaving the pulse former circuit into the analog output data item.

The adjustable probability divider may be constituted, for example, by a binary modulo N divider.

In telephony, the relation between analog output data and digital input data must be of the logarithmic type. The slope of a segment of a straight line of the sequence of segments representing in an approximate way that relation is twice the slope of the preceding segment of a straight line. The invention then provides, according to a further characteristic, for the adjustable probability divider to comprise a binary counter which receives the first stochastic data item and a logic circuit leading to several pre-outputs, respectively the said first stochastic data item and combinations of the latter with the stage state of the binary counter taken in an increasing number starting from the stage which receives the said first stochastic data item, these pre-outputs each being followed by one of the gates controlled by the range digits which thus select a preoutput and enable the sending of a pulse on an output of the divider at each reappearance of the same state of the data received by the selected pre-output.

Thus, by increasing by one unit the number of stages of the binary counter considered, that is, the number of states of the combination, the number of pulses of the first stochastic data item which that binary counter should count before the same sequence occurs again is double and consequently, the probability of the second stochastic data item for a given probability of the first stochastic data item, is again divided by two.

With reference to the accompanying diagrammatic drawings, examples of the implementing of the invention, having no limiting character, will next be described.

DETAILED DESCRIPTION OF THE INVENTION

Figure 1:
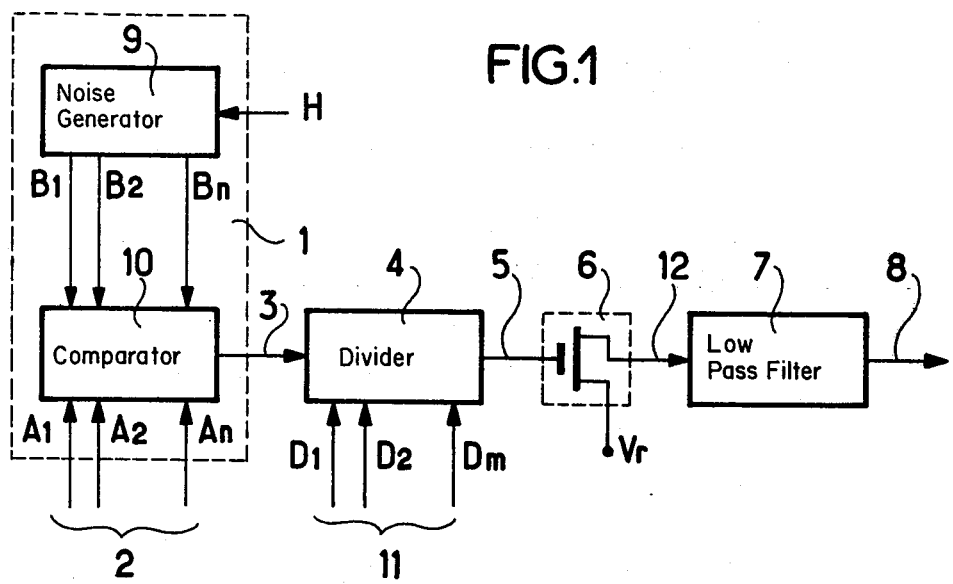
FIG. 1 is the general diagram of a digital-to-analog covertor according to the invention.

That convertor consists of a linear coder 1 which transforms digital data 2 constituted by digits $A_1$ to $A_n$ defining the position of the digital input magnitude in a range of linear conversion values, into a first stochastic signal 3, a probability divider 4 receiving the first stochastic signal 3 and producing a second stochastic signal 5, which, after being put into form in a circuit 6, is sent into a low-pass filter 7 at whose output 8 the data sought is obtained in analog form.

The coder 1 comprises, in a conventional way, a noise generator 9 receiving clock pulses H and a comparator 10.

The divider 4 establishes, between the probability of the stochastic signal 5 and the probability of the stochastic signal 3, a ratio which is adjustable as a function of the range of values in which the digital input data is situated, that range being defined by a data item 11 composed of digits $D_1$ to $D_m$.

The pulse former circuit 6 consists, for example, of at least one MOS (metal oxide semi-conductor) transistor, whose output 12 is connected to the filter 7.

Figure 2:
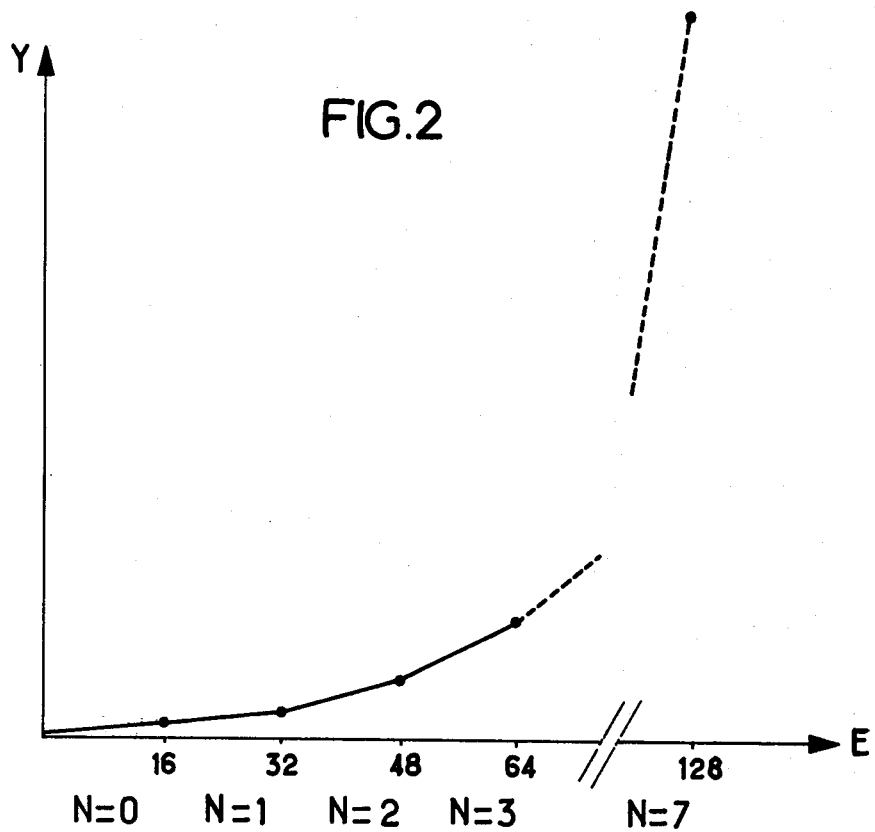
FIG. 2 shows the required relation, in the telephonic applications, between analog output and digital input.

The curve shown approximately by a sequence of segments of straight lines in FIG. 2 shows the relation which is required to be established, in telephony, between the analog magnitude Y sampled at the output 8 and the digital magnitude E entering the digital-to-analog convertor.

It has been assumed, in this example, that the digital magnitude E was defined by 8 digits, one of which is a sign digit and 7 of which define the absolute value, which may thus, at the most, be equal to 128. The coding law, which is symmetrical, in relation to the origin, has been shown only in the positive part. The curve is shown by a sequence of 8 segments of straight lines corresponding to 8 ranges of values each comprising 16 positions. For the first two ranges, the segments of straight lines have the same slope, whereas the slope is double for the third range, quadruple for the fourth range, 8 times greater for the 5 th and so on, the slope being doubled on passing from one range to the next.

The digital input data E is constituted, besides by a sign digit, by three digits $E_5$, $E_6$, $E_7$ defining the number of the range of values (comprised between 0 and 7) and by four digits $E_1$, $E_2$, $E_3$, $E_4$ defining the position of the values in that range (among the 16 possible positions).

The stochastic coding law must be:

$$Pr(S=1)_N = a(KV+U)$$

$Pr$ being the probability that the stochastic signal will assume the value 1, $a$ being a scale factor, $K$ being a coefficient equal to 1 if the number $N$ of the range is 0 and $2^{N-1}$ in all other cases, $V$ being the quantified value of the digital data in the range considered and $U$ being equal to 0 if the number $N$ is 0 and to $2^{N+3}$ in all other cases.

For the probability to be equal to 1 for the maximum value of the input data, $a$ must be equal to $2^{-11}$.

The following is deduced therefrom:

$$Pr(S=1)_N = 2^{N-7}(m \cdot 2^{-1} + V \cdot 2^{-5})$$

where
$m = 0$ if $N = 0$ and
$m = 1$ if $N \neq 0$

In that latter equation, the expression $m \cdot 2^{-1} + V \cdot 2^{-5}$, which may be written $$2^{-5}\left(\sum_{i=1}^{4} E_i 2^{i-1} + m \cdot 2^4\right),$$

may be obtained directly by linear coding of the digital input $E_1$, $E_2$, $E_3$, $E_4$, $m$. These five digits are inserted in the comparator 10, as shown in FIG. 3, in which the noise generator 9 is constituted by a binary counter having 5 stages receiving the clock pulses H from the side on which the digits having a heavy weight are situated.

Figure 3:
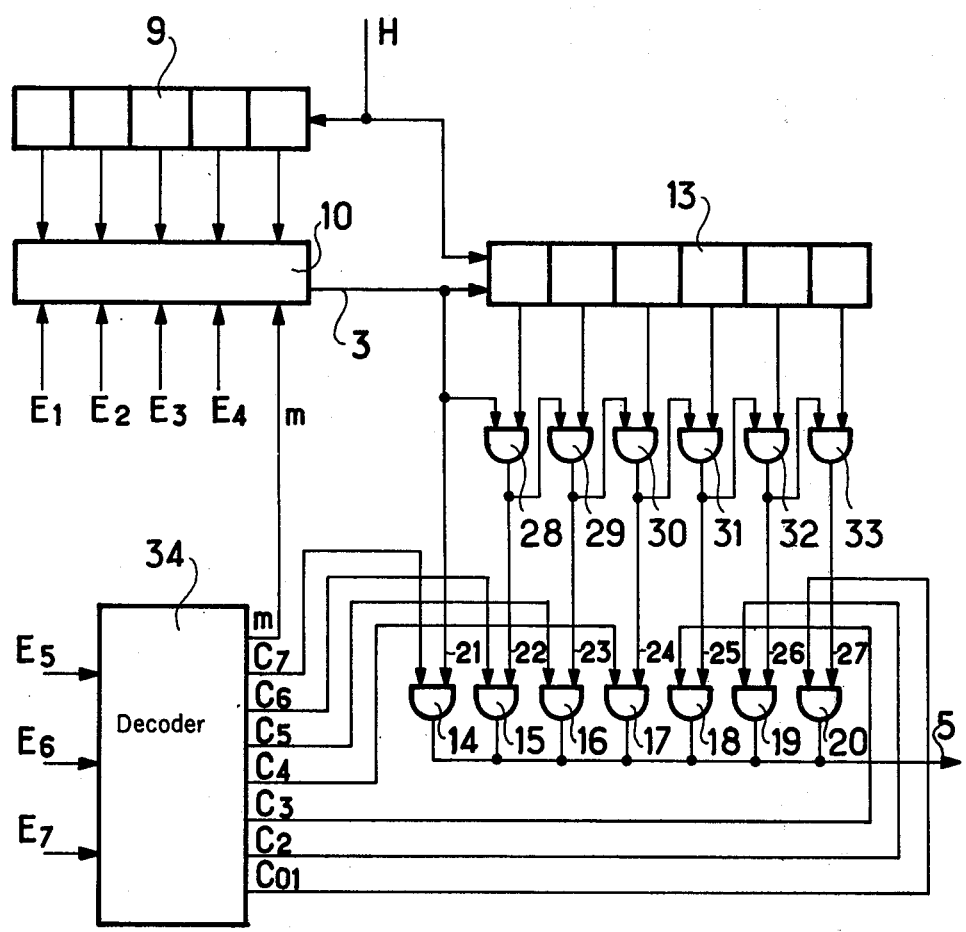
FIG. 3 shows the linear coder and the probability divider in a particular application in telephony.

FIG. 3 also shows the probability divider which has the function of bringing in the coefficient $2^{N-7}$ in the above equation. It consists of a binary counter 13 having 6 stages, receiving in its first stage the first stochastic data 3 and the clock pulses H. Gates 14 to 20 connect to the output 5 pre-outputs 21 to 27, receiving, respectively, the first stochastic data (output 3 of the comparator 10), a combination in:

A gate 28 for that first stochastic data item and for the state of the first stage;

A gate 29 for that first stochastic data item and for the state of the first two stages;

A gate 30 for that stochastic data item and for the state of the first three stages;

A gate 31 for that first stochastic data item and for the state of the first four stages;

A gate 32 for that first stochastic data item and for the state of the first five stages.

A gate 33 for that first stochastic data item and for the state of all the stages of the counter.

The gates 20 to 14 are respectively controlled by a signal $Co_1$, for the first two ranges of values and by signals $C_2$ to $C_7$ for the following six ranges of values of the digital input data. These signals are obtained, as well as the signal $m$, in a decoder 34 receiving the digits $E_5$, $E_6$ and $E_7$ and establishing the following relations:

$m = \underline{E_5} \vee \underline{E_6} \vee E_7$  $\quad V$ = logic sum or disjunction $Co_1 = \underline{E_6} \wedge \underline{E_7}$ $C_2 = \underline{E_5} \wedge E_6 \wedge \underline{E_7}$  $\quad \wedge$ = logic product or conjunction $C_3 = \underline{E_5} \wedge \underline{E_6} \wedge E_7$ $C_4 = \underline{E_5} \wedge E_6 \wedge E_7$ $C_5 = \underline{E_5} \wedge \underline{E_6} \wedge E_7$ $C_6 = E_5 \wedge \underline{E_6} \wedge E_7$ $C_7 = E_5 \wedge E_6 \wedge E_7$ If, for example, the value of the digital input data is situated in the fifth range $N=4$, the gate 17 will be opened and the output 5 will receive a pulse each time a determined sequence, for example, 1, 1, 1, 1, appears in the combination of the first stochastic data item and of the state of the first three stages. The probability of the second stochastic data item obtained at 5 will then be $2^{-3}$ times that of the first stochastic data item, whereas in the first or second range of the values, the gate 20 would be opened and the probability at 5 would be $2^{-6}$ times that at 3.

To increase the rapidity of operation of the probability divider, it is possible to use a binary counter 13 having a smaller number of stages by dividing the gates placed downstream from the pre-outputs, into several groups, making at least certain of the pre-outputs of several gates taken from different groups follow, by connecting the gates of a same group to a distinct output of the probability divider and making a distinct weighting circuit giving a different value to the pulses which it receives from the distinct output, follow that distinct output.

The ratios between the weightings are preferably the multiples of $2^{p+1}$, $p$ being the number of stages of the binary counter 13, since with a counter having $p$ stages, there are $p + 1$ pre-outputs receiving different data items.

Figure 4:
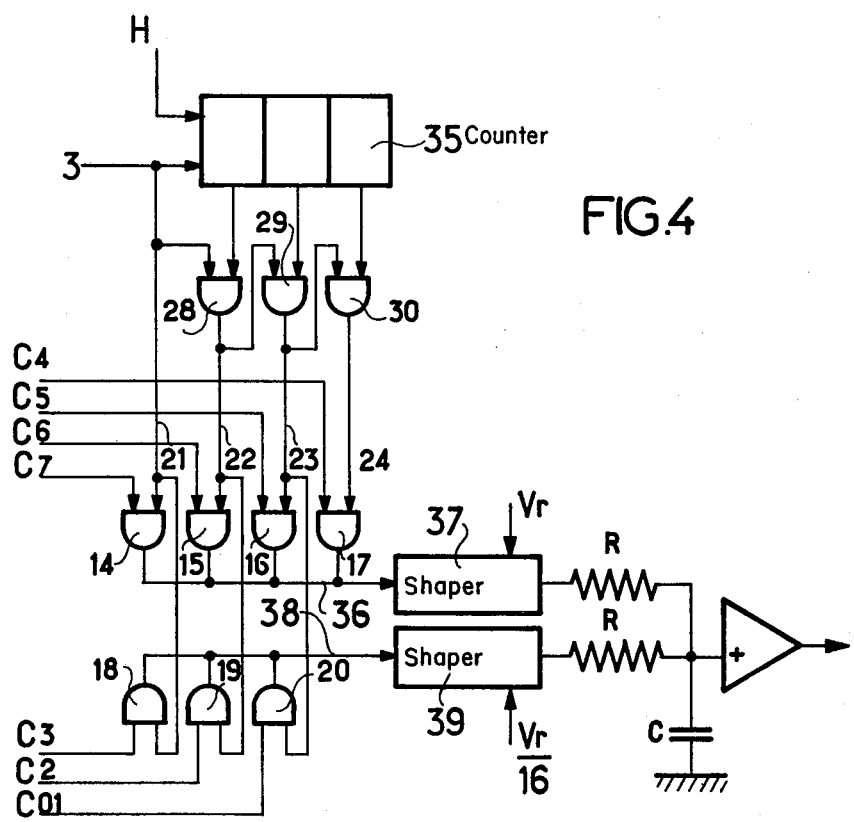
FIG. 4 shows a variant of the probability divider in FIG. 3.

FIG. 4 represents a variant of the probability divider in FIG. 3, in which two groups of gates downstream from the pre-outputs have been provided: a first group comprises the gates 14, 15, 16 and 17 and a second group comprises the gates 18, 19, 20. The binary counter is, here, a counter 35 having three stages and the combinations of stages of the counter are effected in gates 28, 29, 30 equivalent to the gates bearing the same reference in FIG. 3. The pre-outputs 21, 22 and 23 are followed respectively not only by the gates 14, 15 and 16, but also by the gates 18, 19, and 20. The group of the gates 14, 15, 16, 17 is connected to an output 36 followed by a pulse former circuit 37 whose reference voltage is $V_r$, whereas the group of the gates 18, 19, 20 is connected to an output 38 followed by a pulse former circuit 39 whose reference voltage is $v_r/16$, these two pulse former circuits being connected to an identical low- pass filter.

Figure 5:
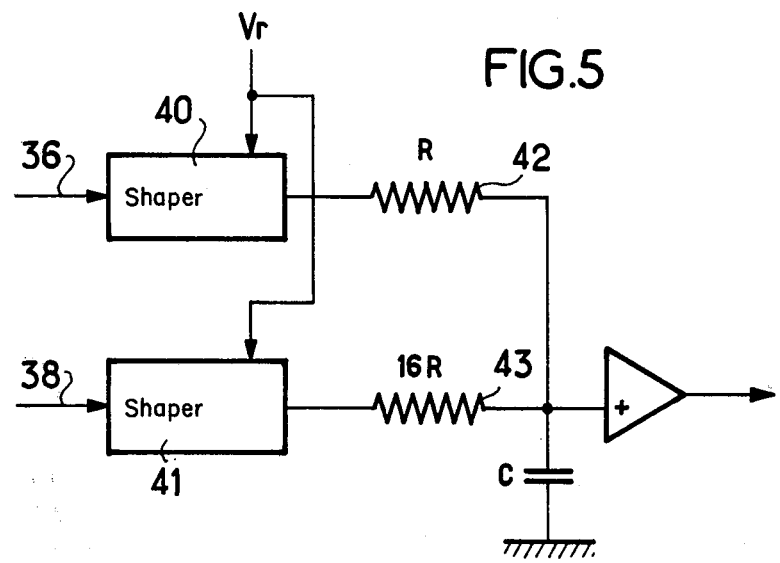
FIG. 5 shows a variant of a portion of the probability divider in FIG. 4.

FIG. 5 shows a variant of the portion: pulse former circuit and low-pass filter in FIG. 4. Here, two analog pulse former circuits 40, 41 having the same reference voltage $Vr$ are used, but the resistances of the low pass filters are distinct and unequal, the one 42 having a value R, whereas the other 43 has a value equal to 16R.

Figure 6:
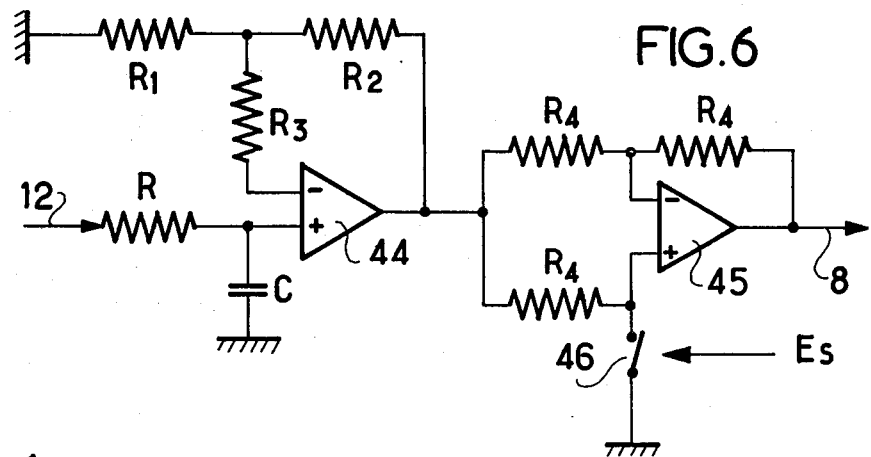
FIG. 6 and 7 show two embodiments of the low-pass filter

FIG. 6 shows a low-pass filter of the first order which may constitute the filter bearing the reference 7 in FIG. 1. That filter consists of an element R - C and of two amplifiers 44 and 45. A switch 46, which may be a transistor, is controlled by the digit whose sign is $E_s$ of the digital input data item in the convertor. That switch 46 has the function of changing the gain of the amplifier 45 making that gain pass from $-1$ when it is closed to $+1$ when it is open.

Figure 7:
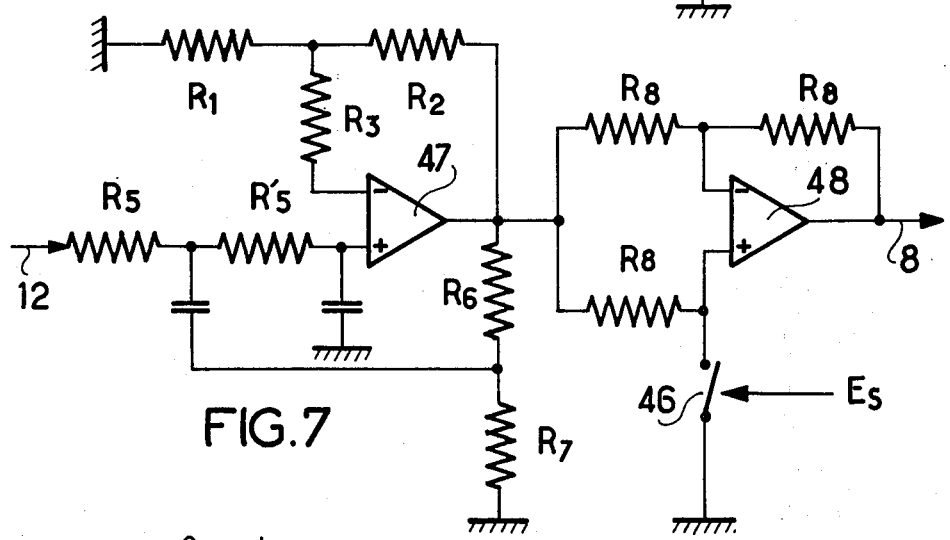

FIG. 7 shows a low-pass filter of the second order with two elements R - C and two amplifiers 47 and 48, it being possible also for that filter to constitute also the filter 7 in FIG. 1.

In the example shown with reference to FIGS. 2, 3, and 4, it has been assumed that the digital input data item was defined by eight digits. Similar diagrams would be applicable to the case of a data item defined by seven digits, for example.

Figure 8:
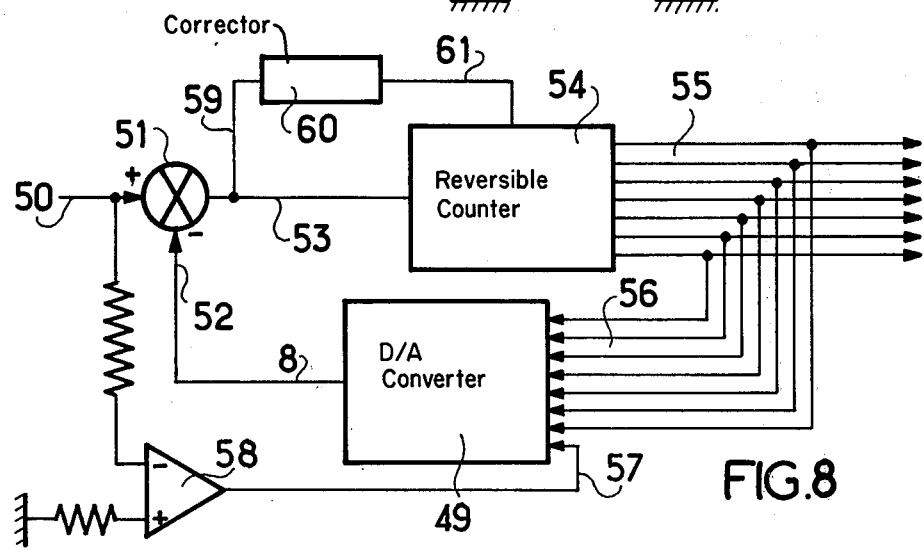
FIG. 8 shows the diagram of an analog-to-digital convertor using, in its servo-control loop, a digital-to-analog convertor such as that in FIG. 1.

FIG. 8 shows how the digital-to-analog convertor shown in FIG. 1 and designated as a whole by the reference 49 can be inserted in the servo-control loop of an analog-to-digital convertor.

The analog data to be coded arrives at 50 on the input of a subtractor 51 whose other input 52 receives the output 8 of the digital-to-analog convertor 49.

The signal obtained at the output 53 of the subtractor 51 drives a reversible counter 54 at whose output 55 the digital data sought is obtained. This latter is sent to the input 56 of the convertor 49. That data consists, in the previously chosen example, of 7 digits, the sign digit 57 being developed in comparator 58 and reinjected directly into the convertor 49.

In the balanced state, the analog data at 8 is equal to the analog input data $E_a$ at 50. The result obtained is then: $E_a = F(S)$, $S$ being the digital data obtained at 55 and $F$ being a non-linear function defining a law of expansion of the data. The result of this is that $S = F^{-1}$ ($E_a$), $F^{-1}$ defining the converse law of compression of the data.

To reduce the response time of the system and to improve the stability of the conversion, servo-controlling between the signal obtained at 53 and the time constant of integration of the reversible counter 54, may be established, so as to reduce the gain of the integrator constituted by that reversible counter when the absolute value of the signal obtained at 53 decreases. A connection 59 connects, for that purpose, the output 53 to a corrector 60 which affects, by a connection 61, the frequency at which the counting or the reverse counting is effected in the reversible counter 54.

I claim:

1. Digital-to-analog convertor with quasi-exponential function generation comprising input means for receiving input signal digits in separate groups, one group comprising range digits (E5 to E7) which are the most significant digits of the input signal and which define a range number (N), another group comprising position digits (E1 to E4) which are the less significant digits of the input signal and which define a position number (V), whereby the input signal value is defined by its position in an input range which is defined by the said range number in a succession of input ranges; linear coding means (part of 10) receiving the position digits and supplying a converted position signal representative of a linearly converted position number ($m.2^{-1} + V.2^{-5}$); a noise generator (9) supplying a noise signal having random values through the range of the converted position number, said values being changed in a random way at a frequency much higher than the highest frequency of the changes in the input signal; a comparator (second part of 10) receiving the converted position signal and the noise signal, said comparator supplying a first stochastic signal (3) the value of which is 0 when the converted position number is lower than the noise signal and 1 when this converted number is higher than the noise signal; a controlled probability divider (4) controlled by the range digits, said divider receiving the first stochastic signal and supplying a second stochastic signal having randomly times values which are either 0 or 1, the probability of said second stochastic signal having the value 1 being equal to the probability of the first stochastic signal having the value 1 divided by a dividing ration, this dividing ratio being controlled by the range digits so as to be defined by the range number; and a low pass filter (7) receiving said second stochastic signal and supplying an output analog signal representative of the digital input signal 2. A convertor according to claim 1, comprising weighting circuits which is coupled to said probability divider and which each give a different value to the pulses which they receive therefrom.

3. A convertor according to claim 2, wherein each of the said weighting circuits comprises a pulse former circuit whose reference voltage is different from the reference voltages of the other pulse former circuits.

4. A convertor according to claim 2, wherein each of the said weighting circuits comprises a resistor of a low-pass filter different from the resistors of the low-pass filters of the other weighting circuits.

5. A convertor according to claim 1 further comprising a clock H supplying clock pulses for driving said noise generator (9), said controlled probability divider comprising a binary counter (13) receiving said clock pulses and counting them on successive binary stages; a succession of dividing gates (28 to 33) opened and closed respectively by the successive stages of said counter; a decoder (34) receiving said range digits, having control output terminals in the same number as the said input ranges, and supplying a control signal on one of these outputs according to the said range number; a succession of pre-output gates (14 to 20) which are respectively controlled by the said control output terminals so that each of these gates is opened by said control signal when supplied to the control output terminal controlling this gate, each of an at least partial succession (15 to 20) of these gates receiving the output signal of a respective said dividing gate and supplying it when opened to the output of the divider; a first of said dividing gates receiving said first stochastic signal and each of the following dividing gates receiving the output signal of the preceding one, whereby said second stochastic signal is supplied to said divider output with probability (Pr) of having the value 1 which is divided, by relation to the first stochastic signal by 2 so many times as there are stages in said binary counter up to inclusively the stage which controls the dividing gate supplying its output signal to the opened pre-output gate.

6. A convertor according to claim 5 in which a first pre-output gate (14) receives the first stochastic signal, a second pre-output gate receiving the output signal of the said first dividing gate, a third pre-output gate receiving the output signal of the second said dividing gate and an $n$ pre-output gate receiving the output signal of the $n-1$ said dividing gate.

7. A convertor according to claim 6 in which said linear coding means (part of 10) is supplied with an addition signal ($m$) from said decoder (34) so as to add a predetermined number ($m$) to said position number to supply said converted position signal, when said range number defines the first input range in the said succession of input ranges.

* * * * *